(12) United States Patent
Schellhorn et al.

(10) Patent No.: US 8,416,412 B2
(45) Date of Patent: Apr. 9, 2013

(54) METHOD FOR DETERMINATION OF RESIDUAL ERRORS

(75) Inventors: Uwe Schellhorn, Aalen (DE); Matthias Manger, Aalen-Unterkochen (DE)

(73) Assignee: Carl Zeiss SMS GmbH, Jena (DE)

( * ) Notice: Subject to any disclaimer, the term of this patent is extended or adjusted under 35 U.S.C. 154(b) by 0 days.

(21) Appl. No.: 12/513,452

(22) PCT Filed: Oct. 23, 2007

(86) PCT No.: PCT/EP2007/009201
§ 371 (c)(1),
(2), (4) Date: Sep. 10, 2009

(87) PCT Pub. No.: WO2008/055589
PCT Pub. Date: May 15, 2008

(65) Prior Publication Data
US 2010/0097608 A1    Apr. 22, 2010

Related U.S. Application Data

(60) Provisional application No. 60/857,884, filed on Nov. 9, 2006.

(51) Int. Cl.
*G01B 11/00* (2006.01)
*G01B 11/14* (2006.01)
*G06F 19/00* (2011.01)
*G01C 17/38* (2006.01)

(52) U.S. Cl.
USPC ............ 356/401; 356/614; 356/620; 702/94; 702/95

(58) Field of Classification Search .................. None
See application file for complete search history.

(56) References Cited

U.S. PATENT DOCUMENTS

| | | | |
|---|---|---|---|
| 4,583,298 A | 4/1986 | Raugh | |
| 5,298,761 A * | 3/1994 | Aoki et al. | 250/548 |
| 5,446,710 A * | 8/1995 | Gardner et al. | 369/44.14 |
| 5,798,947 A | 8/1998 | Ye et al. | |
| 6,317,991 B1 | 11/2001 | Rinn | |
| 6,734,971 B2 * | 5/2004 | Smith et al. | 356/401 |
| 6,934,004 B2 * | 8/2005 | Yoshimura | 355/52 |
| 6,948,254 B2 | 9/2005 | Stiblert et al. | |
| 7,062,397 B1 | 6/2006 | Minor | |

(Continued)

FOREIGN PATENT DOCUMENTS

| | | |
|---|---|---|
| DE | 197 34 695 | 11/1998 |
| EP | 0931241 | 7/1999 |
| WO | 2005124274 | 12/2005 |

OTHER PUBLICATIONS

Raugh, "Absolute two-dimensional sub-micron metrology for electron beam lithography", Proceedings of the SPIE, vol. 480, pp. 145-163 (Jan. 1, 1984).

(Continued)

*Primary Examiner* — Gordon Stock, Jr.
(74) *Attorney, Agent, or Firm* — Fish & Richardson P.C.

(57) ABSTRACT

There is provided a method for determining residual errors, compromising the following steps: in a first step, a test plate comprising a first pattern is used, and in a second step, a test plate comprising a second pattern which is reflected and/or rotated with respect to the first step is used.

21 Claims, 13 Drawing Sheets

U.S. PATENT DOCUMENTS

| | | | |
|---|---|---|---|
| 7,099,011 B2 * | 8/2006 | McArthur et al. | 356/401 |
| 7,271,905 B2 * | 9/2007 | Smith et al. | 356/401 |
| 7,295,291 B2 * | 11/2007 | Smith et al. | 356/124 |
| 7,417,748 B2 * | 8/2008 | Fox et al. | 356/625 |
| 7,586,609 B2 * | 9/2009 | Lin et al. | 356/401 |
| 7,649,614 B2 * | 1/2010 | De Mol | 355/77 |
| 7,871,002 B2 * | 1/2011 | Smith et al. | 235/454 |
| 7,871,004 B2 * | 1/2011 | Smith et al. | 235/454 |
| 2002/0105649 A1 * | 8/2002 | Smith et al. | 356/401 |
| 2005/0088664 A1 | 4/2005 | Stiblert et al. | |
| 2008/0294364 A1 * | 11/2008 | Nara et al. | 702/95 |

OTHER PUBLICATIONS

International Search Report for International Application No. PCT/EP2007/009201 dated Aug. 21, 2008.

M.T. Takac, J. Wittey: "Stage Cartesian self-calibration: a second method", *Proceedings SPIE* 3546 (1998) 498-504.

J. Ye, M. Takac et al.: "An exact algorithm for self-calibration of two-dimensional precision metrology stages", Precision Engineering 20 (1997) 16-32.

G. Antesberger et al.: "Analysis of the Vistec LMS Ipro3 performance and accuracy enhancement techniques", *Proc. Bacus* (2006).

* cited by examiner rms = 1.0 nm
max = 2.7 nm

E o *d*

$C_2$ o *d*

$C_4$ o *d*

$C_4^{-1}$ o *d*

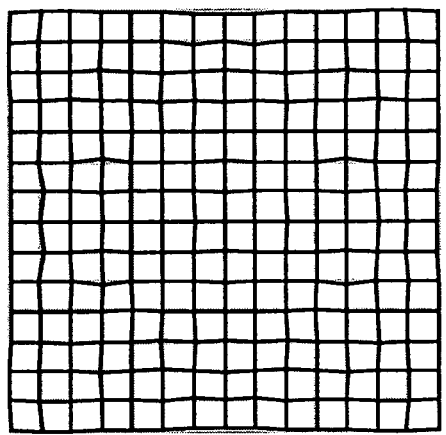
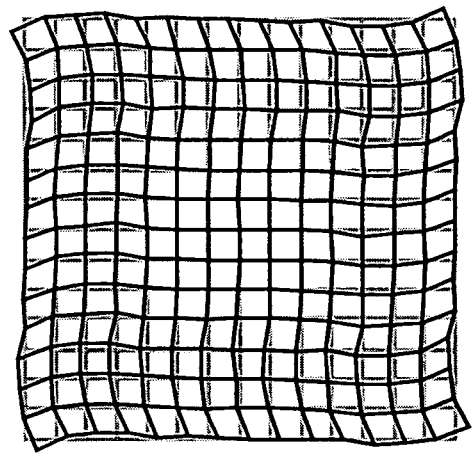
Fig. 4a
Fig. 4b
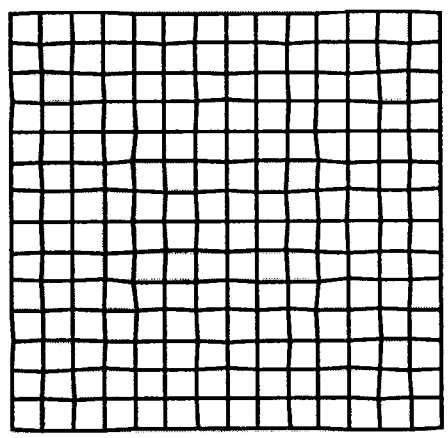
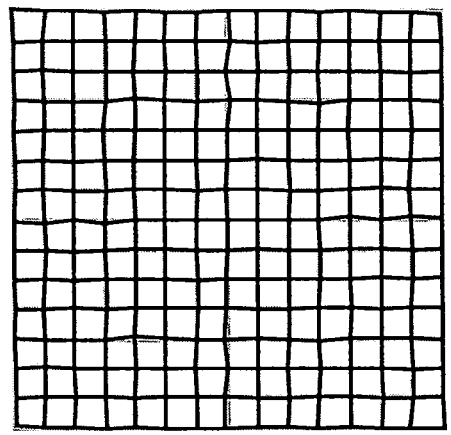
Fig. 4c
Fig. 4d
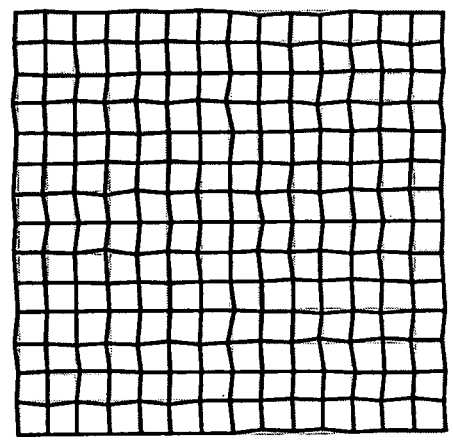
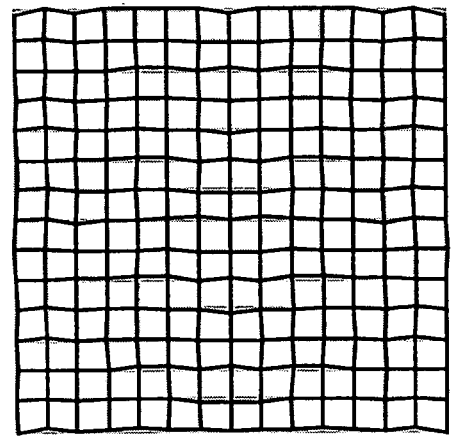
Fig. 4e
Fig. 4f

METHOD FOR DETERMINATION OF RESIDUAL ERRORS

CROSS REFERENCE TO RELATED APPLICATIONS

This application is the National Stage of International Application No. PCT/EP2007/009201, filed on Oct. 23, 2007, which claims priority to U.S. Provisional Application No. 60/857,884, filed on Nov. 9, 2006. The contents of the above applications are herein incorporated by reference.

The present invention relates to methods for determining residual errors, in particular in measurement systems or optical systems. The invention further relates to linearly shiftable stages comprising measurement systems whose residual errors are determined by a corresponding method, as well as to stages and registration measurement machines whose measurement systems are calibrated on the basis of the thus-determined residual errors. The invention further relates to optical systems whose imaging errors are determined on the basis of a corresponding method, as well as to optical systems measured using said method.

Registration measurement machines measure the position of auxiliary marks (typically crosses) on a mask relative to an ideal imaginary Cartesian grid (see top of FIG. 8). The mask is arranged on a two-dimensional shifting unit, which positions the mark to be measured relative to the observation system. The observation system usually consists of an illuminator, imaging optics (e.g. a microscope) as well as a camera. The position of the mark is calculated from the position of the shifting unit and the location of the image on the camera. The registration of the entire mask is defined after each mark has been successively measured. Despite careful adjustment and selection of the components (e.g. highly planar interferometer mirrors), the measurement system of the two-dimensionally shiftable stages has an unacceptable residual error. In order to push the measurement error below few nanometers, the system consequently has to be calibrated. The same problem appears in the mask writers (mask patterners) which print the structures in the wrong places due to inadequacies of the measurement system.

In order to calibrate the inadequate measurement system, a test mask is used which contains adjusting marks on a nominally orthogonal and equidistant grid (see FIG. 1). The currently most precise mask measurement machines from Leica rotate such test mask further at least once by 90° so as to separate the co-rotating errors of the test mask from residual errors of the stationary measurement system. The rotationally symmetric errors are eliminated in a second step in which a second, smaller mask is rotated in steps of 90° around an offset center of rotation. However, in older measurement machines from Leica, the error fields are not treated exactly, but are approximated via finite polynomials.

(M. R. Raugh, "Auto Calibration Method Suitable for Use in Electron Beam Lithography", U.S. Pat. No. 4,583,298 (1984)

K. Rinn: "Verfahren zur Korrektur der Messfehler einer Koordinaten-Messmaschine", Patent EP0931241 (1997)

L. Stiblert and P. Ekberg: "Method for Calibration of a Metrology Stage", U.S. Pat. No. 6,948,254 (2003)

L. Stiblert and P. Ekberg: "Method for Writing a Pattern on a Surface Intended for Use in Exposure Equipment and for Measuring the Physical Properties of the Surface", Patent Application US 2005/0088664 (2003)

[1]M. T. Takac, J. Wittey: "Stage Cartesian self-calibration: a second method", *Proceedings SPIE* 3546 (1998) 498-504

[1]M. R. Raugh: "Absolute two-dimensional sub-micron metrology for electron beam lithography", *Proceedings SPIE* 480 (1984) 145-163

J. Ye, M. Takac et al.: "An exact algorithm for self-calibration of two-dimensional precision metrology stages", Precision Engineering 20 (1997) 16-32

J. Ye, R. Pease et al.: "Methods, Apparatus and Computer Program for Self-Calibrating two-Dimensional Metrology Stages", patent US005798947A (1997)

G. Antesberger et al.: "Analysis of the Vistec LMS Ipro3 performance and accuracy enhancement techniques", *Proc. Bacus* (2006)

U. Schellhorn, M. Manger et al: "Calibrating Method, Measuring Method, Optical Measuring Device and Operating Method, patent application WO 2005124274 (2004)

[1]M. R. Raugh: "Absolute two-dimensional sub-micron metrology for electron beam lithography", *Proceedings SPIE* 480 (1984) 145-163

Newer methods are based on the full discrete Fourier transformation. Nonetheless, both methods treat the rotationally symmetric error patterns in two separate measurement and evaluation steps. (J. Ye, R. Pease et al.: "Methods, Apparatus and Computer Program for Self-Calibrating two-Dimensional Metrology Stages", patent US005798947A (1997))

The Advanced Mask Technology Center, AMTC, has more closely examined the most modern mask measurement machine, "LMS Ipro3" from Leica, using different calibration methods (self-calibration versus built-in Vistec-Normal). The examination has revealed systematic residual errors. The distortion pattern in FIG. 3 shows characteristic s-shaped distortions which increase up to 2.7 nm at the edge and whose root mean square is still at 1.0 nm. In order to be able to meet future requirements, the residual error has to be reduced to one third at least.

Before we provide a technical solution, several group theory considerations will be made first so as to analyze distortion patterns d according to symmetries. The previous methods use rotations by multiples of 90° to separate the various components (FIG. 5). Translated into the language of group theory, they decompose the regular representation which implies the distortion pattern d in an irreducible representation having the corresponding projection operators. With respect to the cyclic $C_4$ group, Character Table 1 yields $$\mathcal{A}\{d\} = \frac{1}{4}(E + C_2 + C_4 + C_4^{-1}) \cdot d, \quad (1)$$

for the 4-wave component $$\mathcal{B}\{d\} = \frac{1}{4}(E + C_2 - C_4 - C_4^{-1}) \cdot d,$$

for the 2-wave component $$\mathcal{E}'\{d\} = \frac{1}{2}(E - C_2) \cdot d,$$

for the 1-wave component

This decomposition is complete up to this point, due to $$d = \mathcal{A}\{d\} + \mathcal{B}\{d\} + \mathcal{E}'\{d\} \quad (2)$$

However, the second linearly independent E-portion for description of all symmetry operations on the basis of d is yet to be described:

$$\mathcal{E}''\{d\} = \frac{1}{2}(C_4 - C_4^{-1}) \cdot d,$$

for the 1-wave component which is rotated around 90° (3)

The placement errors d on the test plate can be separated from the systematic errors of measurement g in metrology by comparing the measured coordinates m{E} in the initial position with those m{C₄} when the test plate has been rotated around 90°.

$$m\{E\} = g + d$$

$$m\{C_4\} = g + C_4 \cdot d \quad (4)$$

(To keep the equations from becoming difficult to follow, the stochastic errors of measurement of the coordinate determination and the amount of deviation errors of the $C_4$-calibration position are missing.) Except for the fully symmetrical A-portion, which cannot be extracted by even further 90°-rotations, separation of the two error contributions is achieved with the help of the above decomposition:

$$\left(\frac{1}{2}E - \frac{1}{4}C_4 + \frac{1}{4}C_4^{-1}\right) \cdot m\{E\} + \left(\frac{1}{2}E + \frac{1}{4}C_4 - \frac{1}{4}C_4^{-1}\right) \cdot m\{C_4\} = \quad (5)$$

$$g + \mathcal{A}\{d\}$$

Up to this point, this procedure corresponds to the prior art.

It is the object of the invention to provide an improved method for determining residual errors.

Advantageous further embodiments are recited in the dependent claims.

Further, a stage which is linearly shiftable in at least one spatial direction, and a registration measurement machine are provided.

Finally, a method of determining imaging errors of an optical system is also proposed.

It is evident that the features mentioned above and those mentioned below, which are yet to be explained, can be used not only in the combinations mentioned, but also in any other combinations, or alone, without departing from the scope of the present invention.

The invention will be explained in more detail below, by way of example and with reference to the enclosed Figures and Tables, which also disclose essential features of the invention. In the drawings:

FIG. 1 shows a Cartesian arrangement of the cross-shaped marks on the test mask, by which the operating errors of the measurement system are calibrated on the two-dimensional shifting unit;

FIG. 2 shows a representation explaining the pattern invariance during rotation of the test plate: although both the large square 1 and the offset, small square 2 are rotated all the way in themselves, invariant patterns do exist; certain rotation-invariant patterns may appear in the rectangular regions 3 indicated in broken lines, while any pattern continued in a rotationally symmetric manner in the corner regions 4 remains unrecognized;

FIG. 3 shows the actually measured error of measurement of an LMS Ipro3, which is located at the Advanced Mask Technology Center in Dresden (said error is as high as 2.7 nm at the corners, the root mean square being 1.0 nm);

FIGS. 4a-4f show the decomposition of the deviation of the Ipro3 measurement system from the ideal Cartesian grid of FIG. 3 to the five irreducible portions of the $C_{v4}$-group; the rotationally symmetric $\mathcal{A}2$-portion is by far the most conspicuous, while the rotation- and mirror-invariant $\mathcal{A}1$-portion is not conspicuous; FIG. 4a shows the $\mathcal{A}1$-portion (rms=0.2 nm; max=0.4 nm), FIG. 4b shows the $\mathcal{A}2$-portion (rms=0.9 nm; max=2.2 nm), FIG. 4c shows the $\mathcal{B}1$-portion (rms=0.2 nm; max=0.3 nm), FIG. 4d shows the $\mathcal{B}2$-portion (rms=0.2 nm; max=0.4 nm), FIG. 4e shows the $\mathcal{E}_1$-portion (rms=0.3 nm; max=0.5 nm) and FIG. 4f shows the $\mathcal{E}_2$-portion (rms=0.2 nm; max=0.6 nm);

Figure 12:
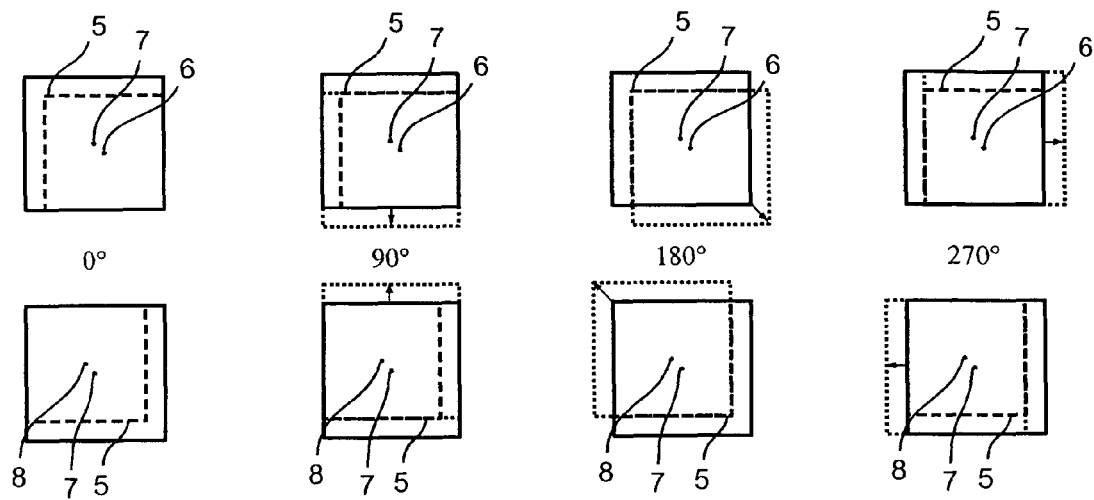
Figure 13:
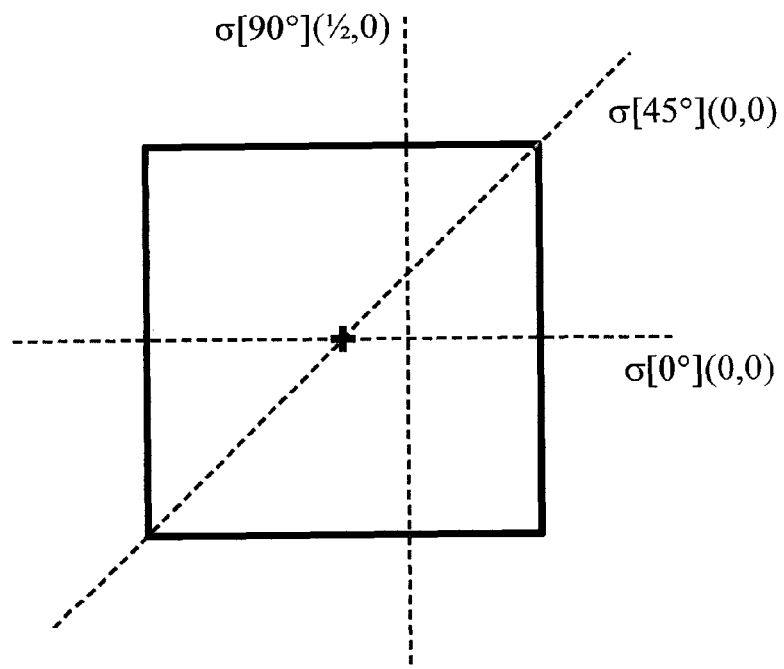
Figure 14:
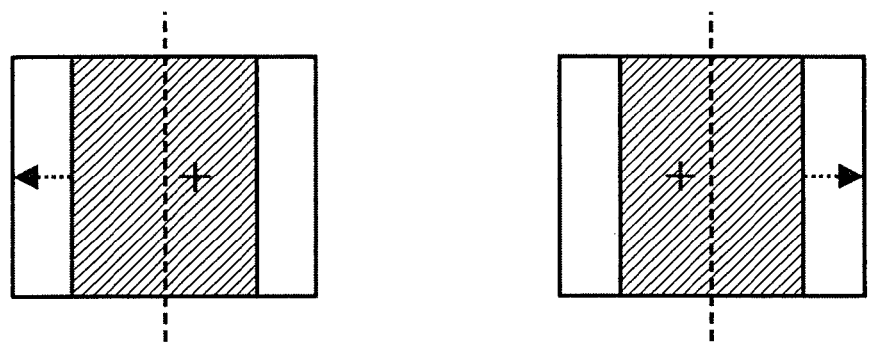
Figure 15:
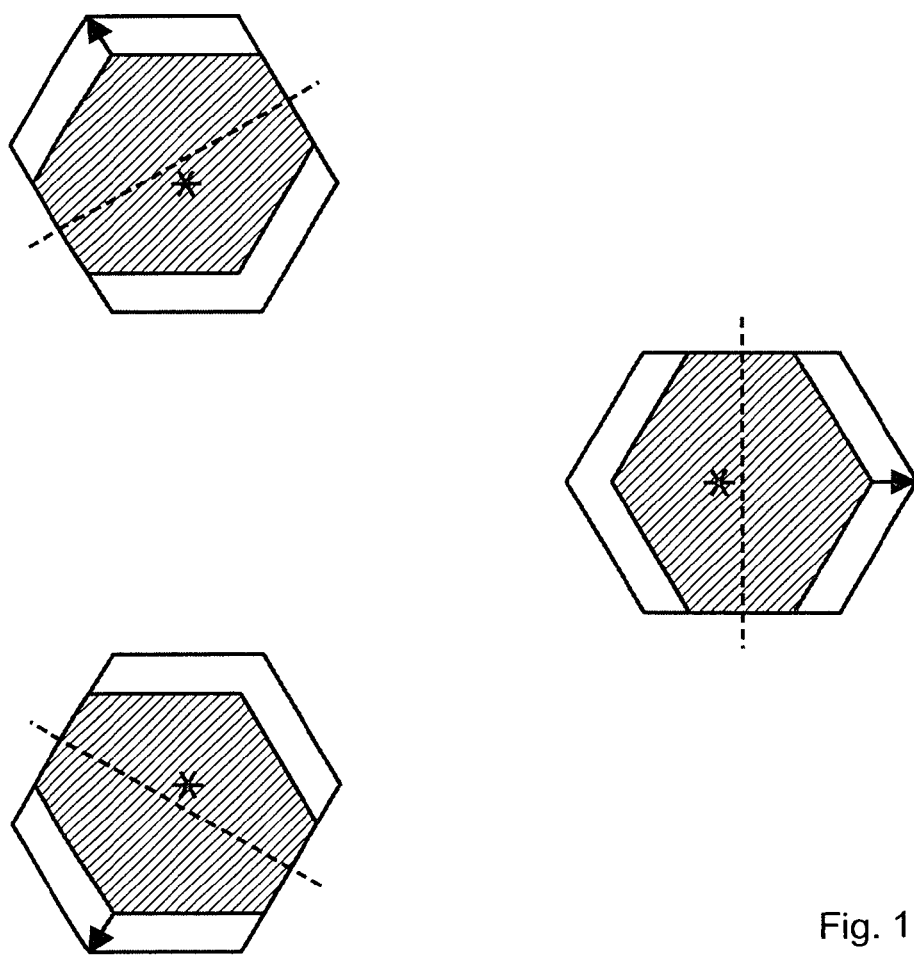
Figure 16A:
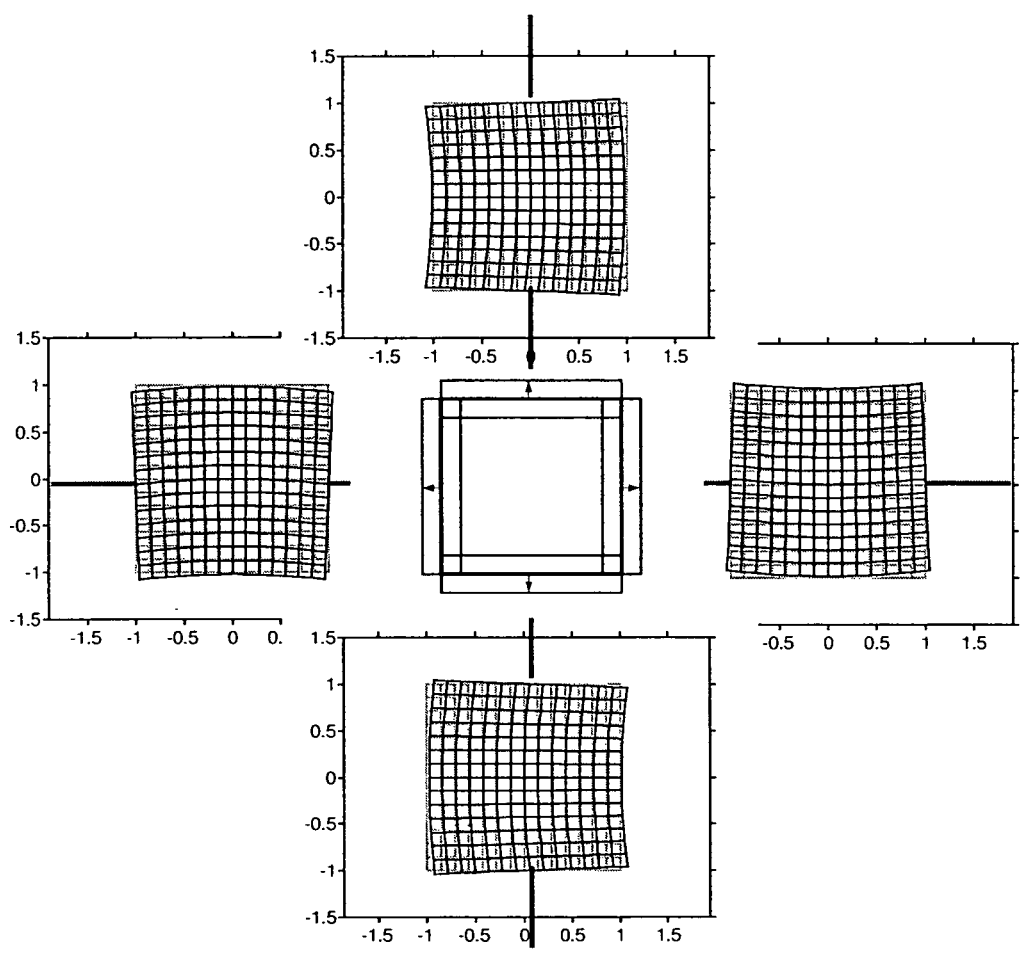
Figure 16B:
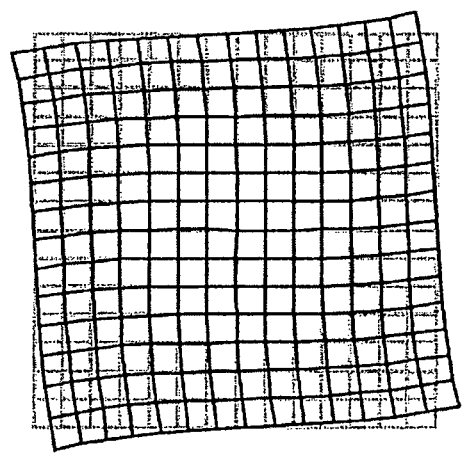
Figure 17:
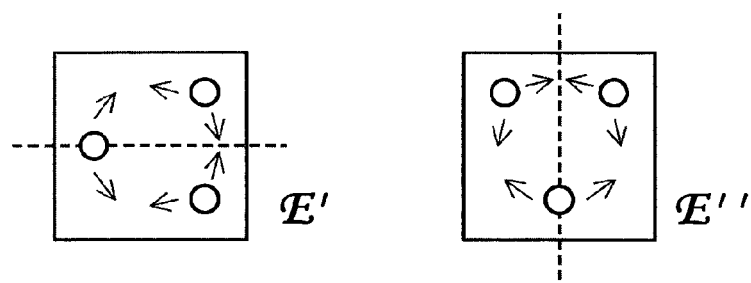
Figure 18A:
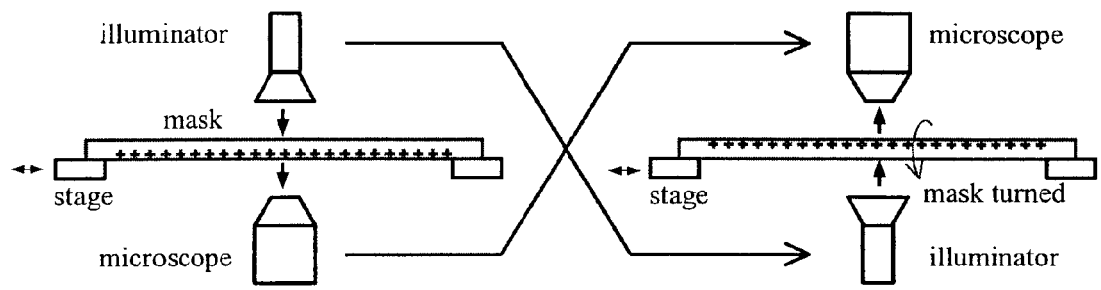
Figure 18B:
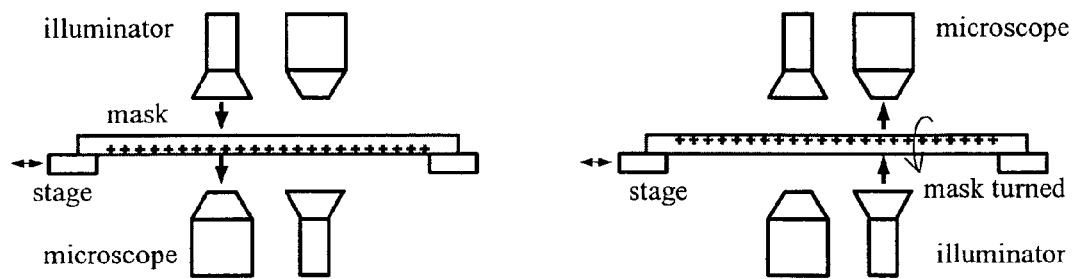
Figure 18C:
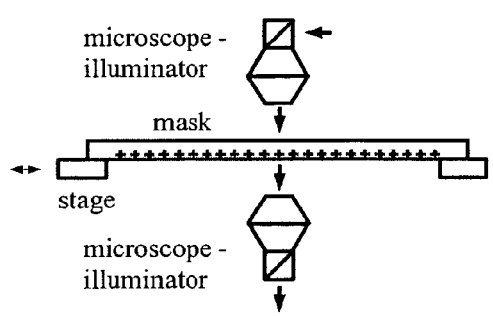
Figure 18C:
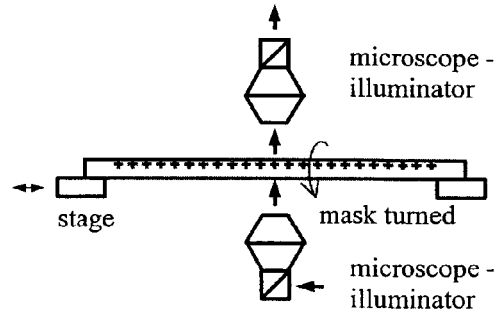
Figure 18D:
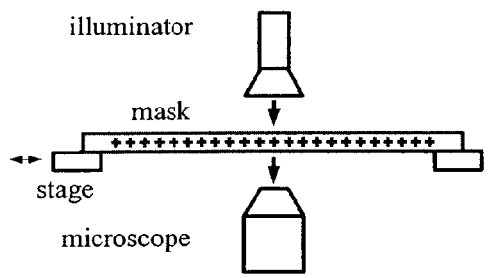
Figure 18D:
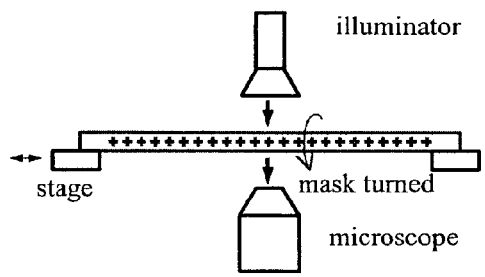
Figure 18E:
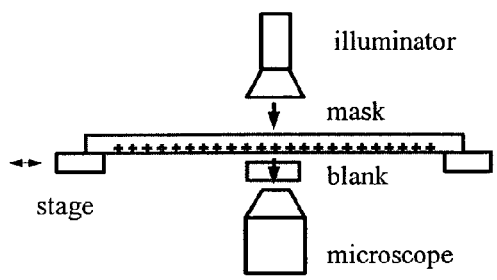
Figure 18E:
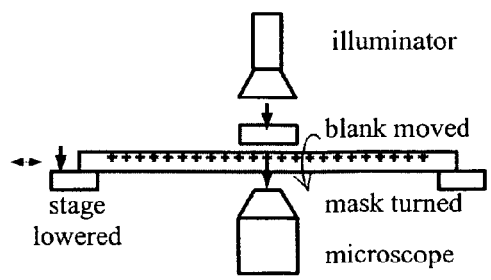
Figure 19:
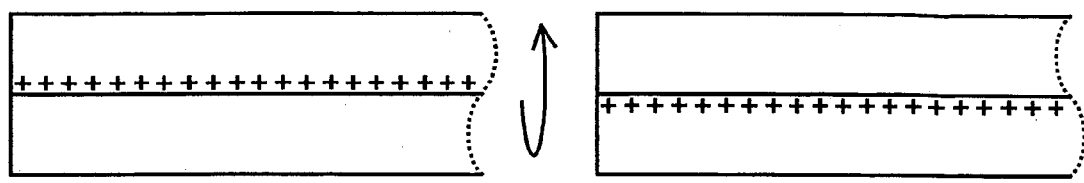
Figure 20:
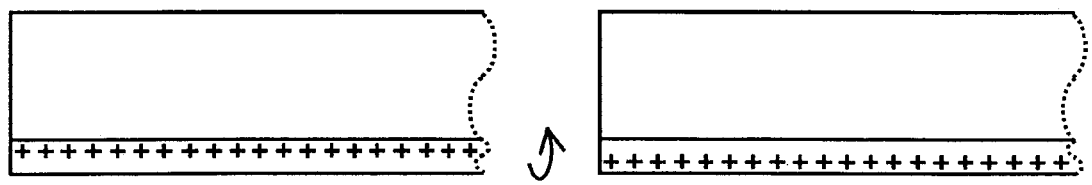
Figure 21:
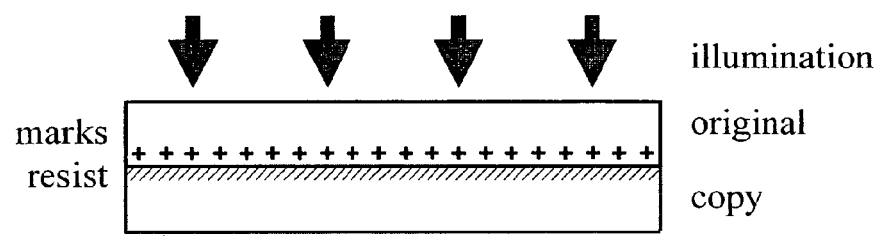
Figure 22:
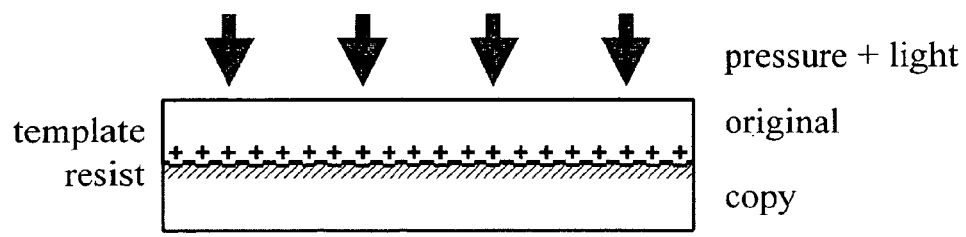
Figure 23:
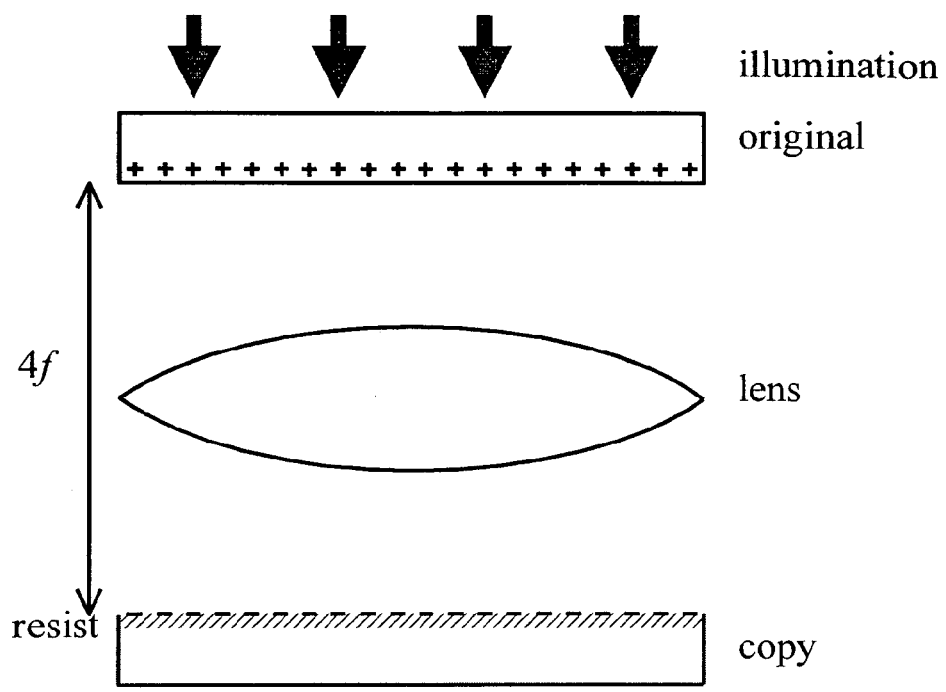
Figure 24:
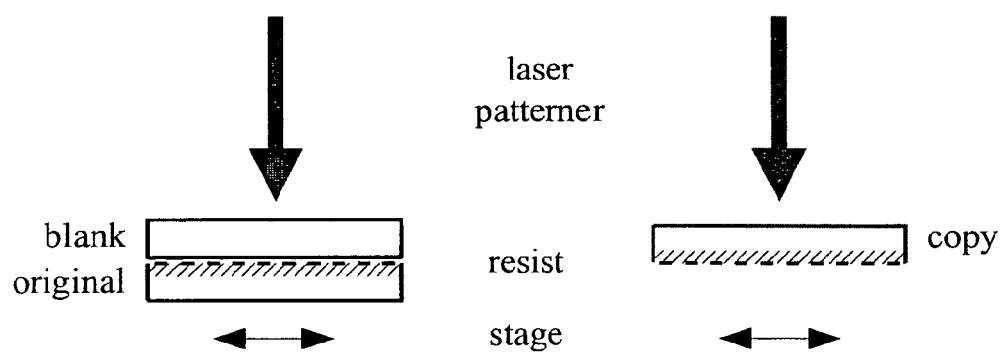
Figure 25:
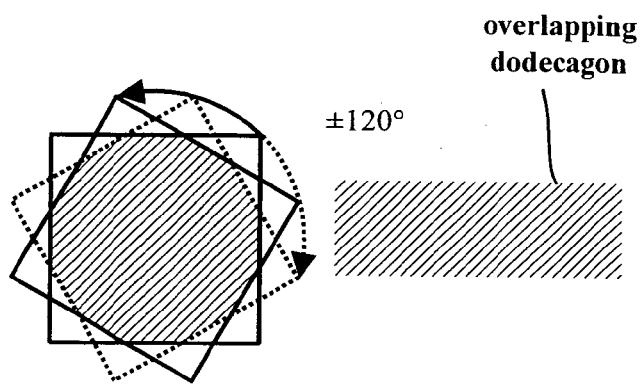
Figure 26:
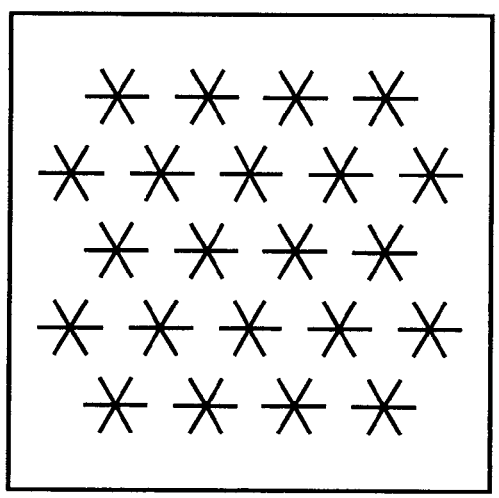

FIG. 12 show illustrations explaining rotation of the mask 5: if the smaller mask (broken lines) is rotated around an eccentric point 6 (center=7), the channels are virtually eliminated unilaterally (above); only if it is additionally rotated around the symmetric point 8 (below), the virtual channels are symmetrically eliminated over all 8 positions;

FIG. 13 shows an illustration explaining the axes of reflection: a complete calibration is achieved by pure reflecting operations if, in addition to the vertical (0°) and diagonal (45°) axes of reflection, there is a further axis of reflection through the center of the substrate, which is eccentric by half a grid unit;

FIG. 14 shows an illustration explaining the axes of reflection: during reflection at one axis, the reflection at the symmetric axis must not be absent; otherwise, the calibration equations will not be so robust with respect to the introduction of errors;

FIG. 15 shows an illustration explaining the axes of reflection: three axes of reflection, rotated 120° relative to each other, are to be arranged symmetrically around the mask center so as to stabilize the calibration equations for the edges;

FIG. 16a shows an illustration explaining the effect of shifting the mask; if the mask (center) is shifted by one grid unit, the measurement system may bend in the worst case, depending on the shifting direction (shown on the outside);

FIG. 16b shows an illustration explaining the effect of shifting the mask; if the bending of the measurement system moves along with the mask as in part a) (FIG. 16a), undistinguishable artefacts will appear in the calibration values, called calibration gaps—in the case of the above exemplary pattern, this is a pattern of the $\mathcal{A}2$ representation;

FIG. 17 shows an illustration explaining the mask holder: an axially symmetric holder of the mask may only induce a distortion pattern in the $\mathcal{E}$ representation due to the boundary conditions;

FIG. 18a shows an illustration of a possible realization of a reflection: in the reflected position of the mask (right), the beam path is inverted by the illumination and the observation system trading places;

FIG. 18b shows an illustration of a possible realization of a reflection: in the reflected position (right), the mask is measured by a second set of an illumination system and an observation system;

FIG. 18c shows an illustration of a possible realization of a reflection: the core components of the optics are designed such that they serve the simultaneous purposes of illumination and observation (left); the light for illumination is coupled in via a prism; in the reflected mask position (right), only the coupling-in of the illumination and the coupling-out of the observation are exchanged; it may be left open, if further components (lamps or cameras) are provided in duplicate or the beams are deflected to the portions via glass fibers or mirrors;

FIG. 18d shows an illustration of a possible realization of a reflection: if the marks are located at the center of the thickness of the mask (left), they are observed by the same optics in the reflected position (right);

FIG. 18e shows an illustration of a possible realization of a reflection: the substrate thickness is allowed for during measurement by a glass plate having the same thickness (left); when the mask is reflected (right), the glass plate is removed or is kept ready on the illumination side, respectively;

FIG. 19 shows an illustration of a possible realization of a reflection: the marks are located on the lower side of the upper half of the shallowly divided mask—schematically indicated by crosses; the lower half is joined by a suitable method (e.g. optical contacting) (left); when reflecting one half of the pair as an entire block, the plane in which the marks are located does practically not change its position (right);

FIG. 20 shows an illustration of a possible realization of a reflection: the marks are located on a thin layer, which is joined below the thick substrate (left); in order to reflect the marks, the thin layer is just turned over and joined to the thick substrate again (right); the plane in which the marks are located changes its position only slightly (right);

FIG. 21 shows an illustration of a possible realization of a reflection: if exposure is effected through the original mask onto a photosensitive mask, the contact copy will contain the same marks—only mirrored and inverted; chromium and glass are interchanged once more by a corresponding positive resist;

FIG. 22 shows an illustration of a possible realization of a reflection: using the nanoimprint technology, a reflected copy of the original serving as a template can be generated;

FIG. 23 shows an illustration of a possible realization of a reflection: using 4f imaging, the original is written onto the copy in a reflected fashion;

FIG. 24 shows an illustration of a possible realization of a reflection: a laser writer first exposes the test mask (left) through a blank plate, then exposes a substrate turned upside down (right), whereupon the marks are written upside down with respect to the original test mark;

FIG. 25 shows an illustration explaining the determination of four-wave error patterns: Rotations around 120° (or 30°, respectively) reveal four-wave error patterns (the overlapping dodecagon is represented by hatching), and FIG. 26 shows a hexagonal grid on a square mask.

Figure 6:
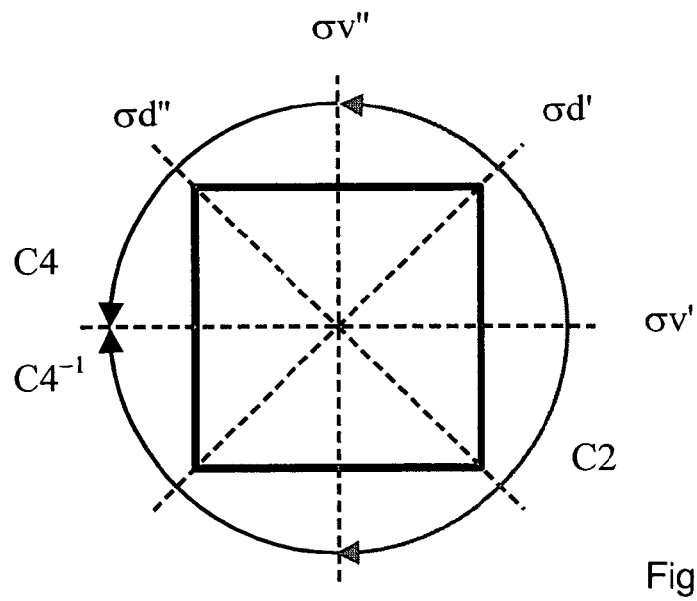
FIG. 6 shows an illustration of the 8 symmetry operations on a square under the symmetry group $C_{4v}$—identity E, 180° rotation C2, 2×90° rotations C4, 2× axial reflections $\sigma_v$, 2× diagonal reflections $\sigma_d$.

However, all of the published methods neglect the fact that the square edge of the mask implies a $C_{4v}$-group which also contains axes of reflection according to FIG. 6. Especially the reflections have so far not been mentioned as a further calibration operation in the prior art.

Figure 7:
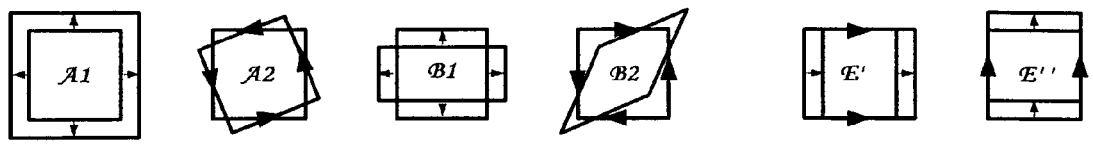
FIG. 7 shows an illustration of the five irreducible $C_{4v}$ representations of Table 3 by simple vector fields, such as those which play a role in registration measurement technology.

Each pattern d can be decomposed to five irreducible representations according to the respective character table 3:

$$\mathcal{A}_1\{d\} = \frac{1}{8}(E + C_2 + C_4 + C_4^{-1} + \sigma_v' + \sigma_v'' + \sigma_d' + \sigma_d'') \cdot d \quad (6)$$

$$\mathcal{A}_2\{d\} = \frac{1}{8}(E + C_2 + C_4 + C_4^{-1} - \sigma_v' - \sigma_v'' - \sigma_d' - \sigma_d'') \cdot d$$

$$\mathcal{B}_1\{d\} = \frac{1}{8}(E + C_2 - C_4 - C_4^{-1} + \sigma_v' + \sigma_v'' - \sigma_d' - \sigma_d'') \cdot d$$

$$\mathcal{B}_2\{d\} = \frac{1}{8}(E + C_2 - C_4 - C_4^{-1} - \sigma_v' - \sigma_v'' + \sigma_d' + \sigma_d'') \cdot d$$

$$\mathcal{E}_1'\{d\} = \frac{1}{4}(E - C_2 + \sigma_v' - \sigma_v'') \cdot d$$

$$\mathcal{E}_2'\{d\} = \frac{1}{4}(E - C_2 - \sigma_v' + \sigma_v'') \cdot d$$

i.e. to scale-type $\mathcal{A}1$, rotation-type $\mathcal{A}2$, anamorphotic $\mathcal{B}1$ and $\mathcal{B}2$ as well as to centrable $\mathcal{E}$—illustrated in FIG. 7. For the sake of an unambiguous representation, we shall differentiate between two equivalent but differing representations of $\mathcal{E}$, depending on how they behave with respect to an axial reflection:

$$\sigma_v' \cdot \mathcal{E}_1'\{d\} = +\mathcal{E}_1'\{d\}$$

$$\sigma_v' \cdot \mathcal{E}_2'\{d\} = -\mathcal{E}_2'\{d\} \quad (7)$$

With this convention, all representations with index 2 switch their mathematical sign by $\sigma_v'$ reflection, whereas those with index 1 behave invariantly. With analogy to the above, two further linearly dependent portions are still missing, i.e.

$$\mathcal{E}_1''\{d\} = \frac{1}{4}(C_4 - C_4^{-1} + \sigma_d' - \sigma_d'') \cdot d \quad (8)$$

$$\mathcal{E}_2''\{d\} = \frac{1}{4}(C_4 - C_4^{-1} - \sigma_d' + \sigma_d'') \cdot d$$

to represent all symmetry operations by the basis d:

$E \cdot d = \mathcal{A}_1\{d\} + \mathcal{A}_2\{d\} + \mathcal{B}_1\{d\} + \mathcal{B}_2\{d\} + \mathcal{E}_1'\{d\} + \mathcal{E}_2'\{d\}$ $C_2 \cdot d = \mathcal{A}_1\{d\} + \mathcal{A}_2\{d\} + \mathcal{B}_1\{d\} + \mathcal{B}_2\{d\} - \mathcal{E}_1'\{d\} - \mathcal{E}_2'\{d\}$ $C_4 \cdot d = \mathcal{A}_1\{d\} + \mathcal{A}_2\{d\} - \mathcal{B}_1\{d\} - \mathcal{B}_2\{d\} + \mathcal{E}_1''\{d\} + \mathcal{E}_2''\{d\}$ $C_4^{-1} \cdot d = \mathcal{A}_1\{d\} + \mathcal{A}_2\{d\} - \mathcal{B}_1\{d\} - \mathcal{B}_2\{d\} - \mathcal{E}_1''\{d\} - \mathcal{E}_2''\{d\}$ $\sigma_v' \cdot d = \mathcal{A}_1\{d\} - \mathcal{A}_2\{d\} + \mathcal{B}_1\{d\} - \mathcal{B}_2\{d\} + \mathcal{E}_1'\{d\} - \mathcal{E}_2'\{d\}$ $\sigma_v'' \cdot d = \mathcal{A}_1\{d\} - \mathcal{A}_2\{d\} + \mathcal{B}_1\{d\} - \mathcal{B}_2\{d\} - \mathcal{E}_1'\{d\} + \mathcal{E}_2'\{d\}$ $$\sigma_d' \cdot d = \mathcal{A}_1\{d\} - \mathcal{A}_2\{d\} - \mathcal{B}_1\{d\} + \mathcal{B}_2\{d\} + \mathcal{E}_1''\{d\} - \mathcal{E}_2''\{d\}$$

$$\sigma_d'' \cdot d = \mathcal{A}_1\{d\} - \mathcal{A}_2\{d\} - \mathcal{B}_1\{d\} + \mathcal{B}_2\{d\} - \mathcal{E}_1''\{d\} + \mathcal{E}_2''\{d\} \quad (9)$$

Thus, in total, twice as many linearly independent portions are obtained as under the $C_4$-subset:

$$\mathcal{A}\{d\} = \mathcal{A}_1\{d\} + \mathcal{A}_2\{d\}$$

$$\mathcal{B}\{d\} = \mathcal{B}_1\{d\} + \mathcal{B}_2\{d\}$$

$$\mathcal{E}'\{d\} = \mathcal{E}_1'\{d\} + \mathcal{E}_2'\{d\}$$

$$\mathcal{E}''\{d\} = \mathcal{E}_1''\{d\} + \mathcal{E}_2''\{d\} \quad (10)$$

Adding a measurement $m\{\sigma_v'\}$ using a reflected test plate $\sigma_v' \cdot d$ to (4) would further limit the portion $\mathcal{A}(d)$ in (5), which cannot be calibrated, to the level-one representation $\mathcal{A}1$. It is likewise possible, using only two reflected calibration positions $$m\{E\} = g + d$$

$$m\{\sigma_v'\} = g + \sigma_v' \cdot d$$

$$m\{\sigma_d'\} = g + \sigma_d' \cdot d \quad (11)$$

to separate the not fully symmetric portions of the measurement system g from the unknown test plate d:

$$\frac{1}{2}m\{E\} + \frac{1}{4}m\{\sigma_v'\} + \frac{1}{4}m\{\sigma_d'\} + \quad (12)$$

$$\frac{1}{16}(2C_4 - 2C_4^{-1} + 3\sigma_v' - \sigma_v'' - 3\sigma_d' + \sigma_d'') \cdot (m\{\sigma_d'\} - m\{\sigma_v'\}) = g + $$

$$\mathcal{A}1\{d\}$$

The evaluation only applies the known symmetry operations from the $C_{4v}$-group to the measured coordinates m from (11).

So much for the theoretical preliminary considerations—back to the real problems of existing measurement machines. The pattern of FIG. 3 for Ipro3 contains mainly the $\mathcal{A}2$-representation, as evident from the decomposition (breakdown) in FIGS. 4a-4f. According to the character table, this representation behaves invariantly for all rotations $\chi_{\mathcal{A}2}(C2)=1$ and $\chi_{\mathcal{A}2}(C4)=1$, but not for reflections $\chi_{\mathcal{A}2}(\sigma_v)=-1$ and $\chi_{\mathcal{A}2}(\sigma_d)=-1$. If the $\mathcal{A}2$-portion were decreased to a level comparable to that of the other five portions, the root mean square residual error would be reduced by more than one half and the maximum error present would even be reduced to one third.

In order to reduce or even avoid the prominent $\mathcal{A}2$ problems, we have added two new, different features to the known methods of self-calibration. One approach adds easy-to-realize calibration positions so as to avoid undesired side effects, while the other approach avoids the $\mathcal{A}2$ patterns with mathematical precision, but is technically feasible only with a greater effort.

Symmetric Calibration Positions

Figure 8:
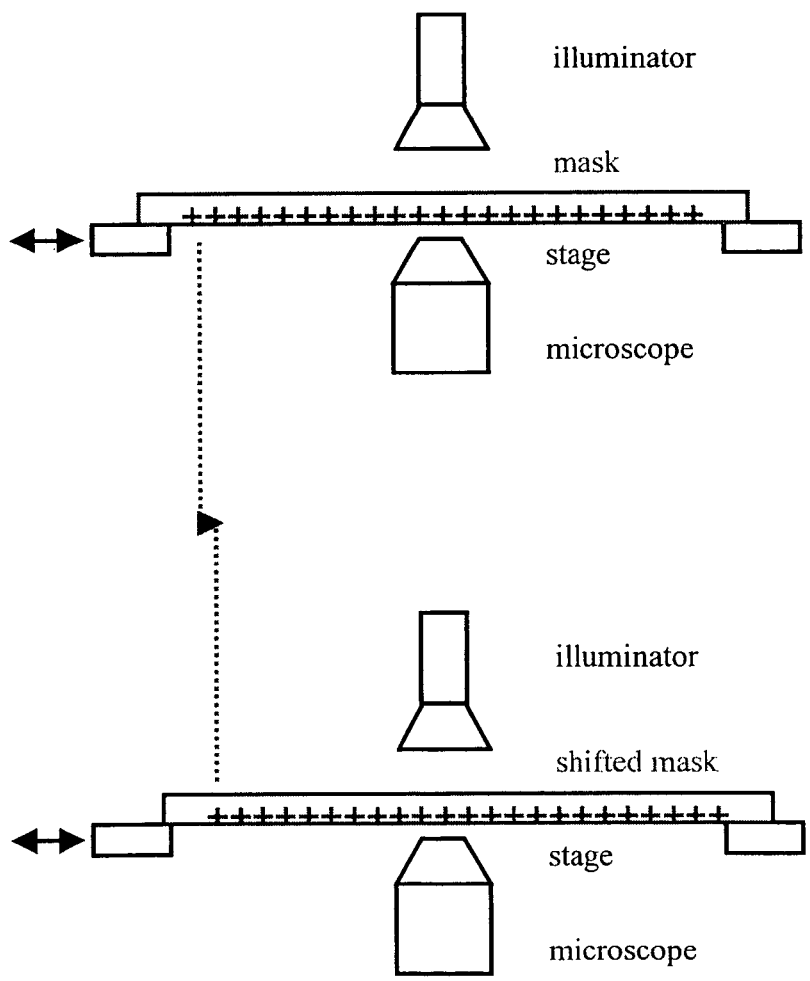
FIG. 8 shows a typical construction for measurement of the mark positions on a mask (above); for calibration, the mask is inserted in the receiving part with an offset (below) or/and rotated (not shown)

At our company, we develop and practice exact grid-invariant self-calibration. "Grid-invariant" means that only those translations and rotations are allowed which image one measurement channel (grid point) onto another existing measurement channel (see FIG. 8). "Exact" means that the calibration values are not low passband filtered by interpolation, but each channel with its individual value is separately processed out of the measured field m. Although the linear equation systems grow enormously, they can be managed by modern computers. Moreover, said comprehensive equation system allows the separation between the different symmetries, which unnecessarily destabilize the equation system, to be dispensed with then. In addition, we consider interference patterns p which occur in the various calibration positions K for reasons of construction. Unlike what is described in the literature, we consider not only offset errors (translation and rotation), but also effects such as those which arise, for example, from telecentricity and defocusing or focal tilt. Our equation system for the unknown test plate d, the measurement system g to be determined, as well as the uncontrollable amplitudes P of the interference parameters, thus, looks as follows:

$$m\{K\} = g + K \cdot d + \sum_p P_p\{K\} \cdot p_p \quad (13)$$

Figure 1:
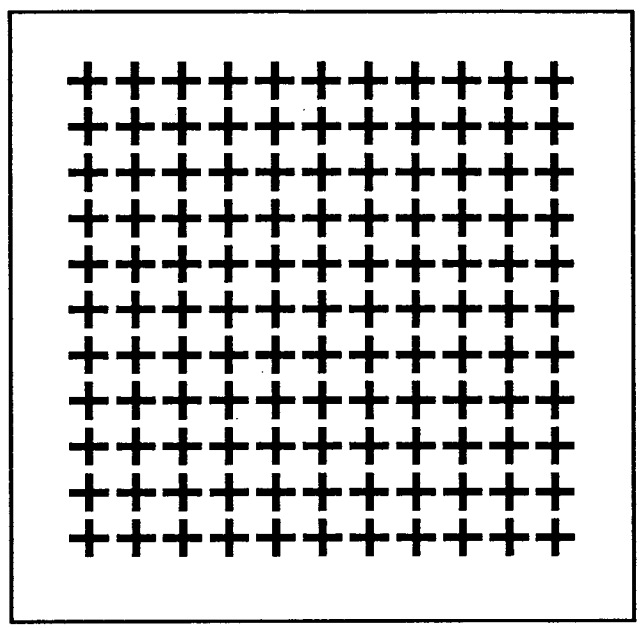
Figure 2:
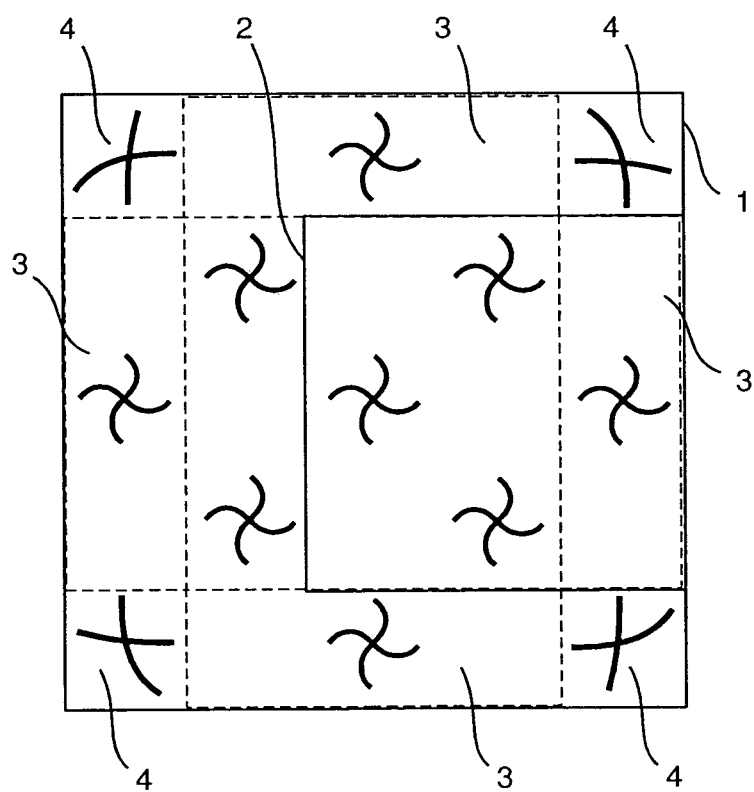
Figure 3:
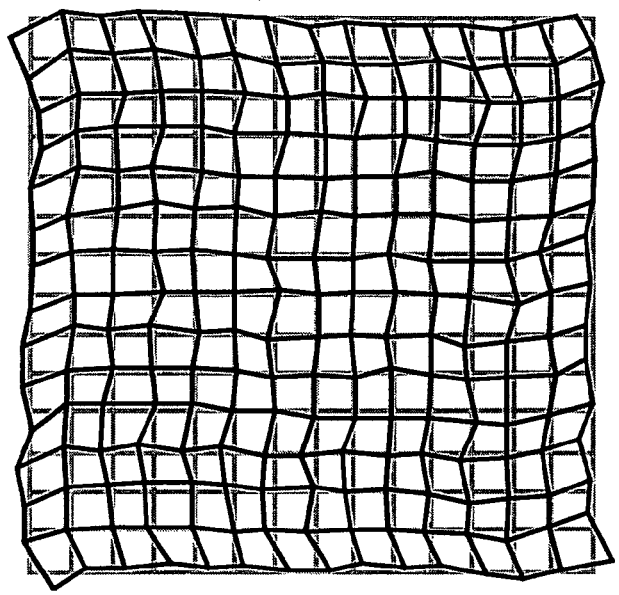
Figure 5:
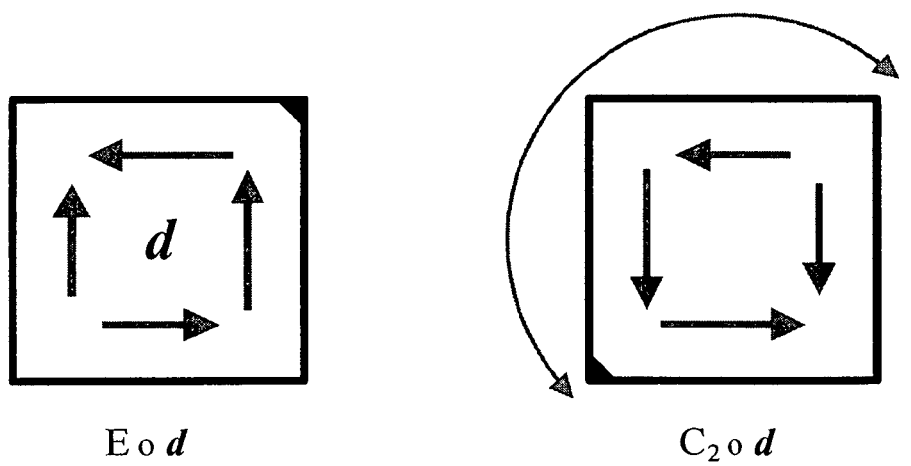
FIG. 5 shows an application of the four rotation operations of the $C_4$ group to a vector field d.
Figure 9:
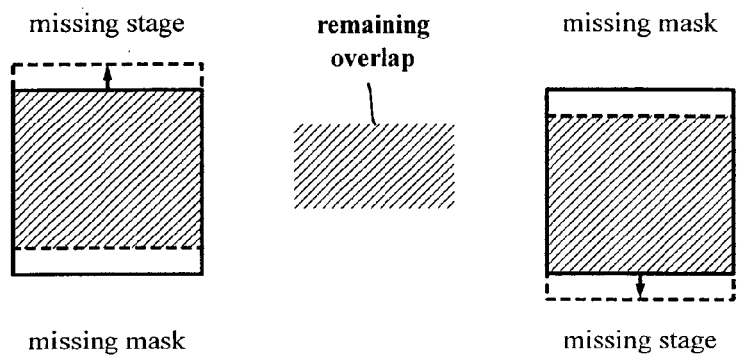
FIG. 9 shows an illustration explaining the shift of the test piece 5; when shifting the mask 5 (in broken lines), mask channels are eliminated on one side and sensor channels are eliminated on the other side (left); when shifting it in the opposite direction, they are eliminated on the opposite side (right); the remaining overlap is respectively hatched.

When shifting the test piece d or a suitable test object relative to the sensor system g, several channels are inevitably eliminated at the edge (left-hand side of FIG. 9). Errors in calibration thereby strongly increase towards the edge. Although the rotations about the mask center compensate them again, the rotation-invariant errors remain, as shown in FIG. 3, for example. Normally, the $\mathcal{A}1$ and $\mathcal{A}2$-patterns are approximately equally intense.

Figure 10:
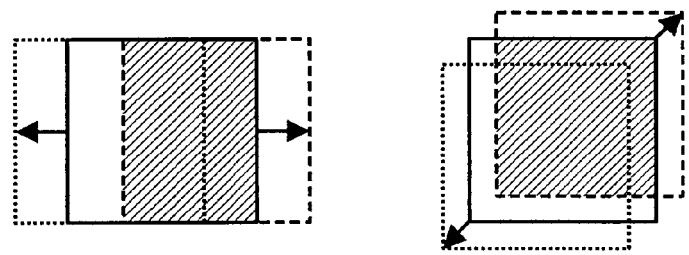
FIG. 10 shows an illustration explaining the shift of the test piece 5; when shifting it in other directions or over further distances, the shift in the opposite direction (dotted line) must not be absent; otherwise, channels will also be asymmetrically eliminated here, which will have an unfavorable influence on the stability of the calibration equations.
Figure 11:
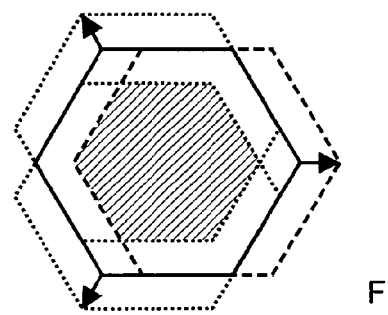
FIG. 11 shows a representation explaining the shift of the test piece 5; symmetric shifting positions at 120° for a hexagonal calibration.

It has turned out that the edge errors decrease considerably whenever the shifting positions are present as symmetric pairs in the calibration sequence. Thus, if a shift by one grid unit is effected in the +y direction, the calibration position moved by one grid unit in the −y direction must not be absent (right-hand side of FIG. 9). The same goes for the x axis, combinations of x and y and further shifting paths, as well as for shifts in a rotated position, see also the examples in FIG. 10. The errors will then propagate weakly towards the edge if the calibration positions are symmetrically approached. Therefore, the desired effect is also achieved if three shifts are at 120° to one another (FIG. 11).

This new finding represents an independent aspect of the present invention. It can be easily transferred to the double plate method as in the Leica measurement machines. In this case, the various axes of rotation are to be arranged symmetrically around the center of the region to be calibrated, as illustrated in FIG. 12. In other words, the edge of the smaller mask has to contact the opposite side in a second calibrating cycle.

Nevertheless, it may happen that certain rotation-symmetric A-error patterns remain during calibration. If the mask is inserted such that it is shifted by the translation T relative to the rest of the machine, the measurement system may, for example, bend unfavorably such that it simulates a gradient in the distortion , of the test mask, although such distortion is not present.

$$p\{T\} \propto T \cdot d_\mathcal{A} \quad (14)$$

If, as illustrated in FIG. 16, the simulated distortion $d_\mathcal{A}$ is part of the level-one representation $\mathcal{A}$ of $C_4$, grid-invariant rotations will not be able to detect it. Novel calibration positions are helpful, at least, with respect to the $\mathcal{A}2$-portion.

Reflections

One novel calibration position is the reflection of the test mask (generally, a test piece) relative to the measurement system (generally, a sensor system) to be calibrated. Like a shift or rotation, the reflection performs a rigid body movement which does not alter the geometrical position of the channels relative to each other. The spacing between the channels remains the same, whereas the (oriented) angles switch their mathematical signs. Certain rigid body offset errors (deviation from the ideal reflection) can be tolerated several orders of magnitude above the accuracy of measurement to be achieved. In the reflected position, shifting and/or rotation of the mask to further calibration positions is allowed. Especially the rotations in the reflected position help to stabilize the $\mathcal{B}1$- and $\mathcal{B}2$-patterns even more narrowly. It makes sense, in particular, to reflect the mask at further axes of reflection.

It is also possible to dispense with rotations and shifts of the test mask altogether. In the above equation (12), we have shown that two reflections are sufficient to calibrate all not fully symmetric portions. The remaining $\mathcal{A}1$-portion is finally eliminated by a further reflection at an axis which no longer extends through the center of the mask. A grid-invariant symmetry operation is observed if, for example, the additional axis of reflection results from a shift of a $C_{4v}$-axis of reflection by half a grid unit, see also FIG. 13.

As described in the above paragraph 0, the conditioning of the edge channels improves if the calibration positions are arranged symmetrically around the center of the mask. Transferred to the reflecting self-calibration, this means that for each axial reflection there is to be also the counterpart in the calibration positions, the axis of reflection of said counterpart being symmetric thereto, as shown by way of example in FIG. 14. The axes of reflection need not occur in pairs. For example, in the case of three axes, it is sufficient if they are rotated 120° relative to each other about the center of the mask (FIG. 15).

In the following paragraphs, we shall introduce various realizations which do not exclude other designs serving the same purpose of a reflection. The first possibility envisages upside down insertion of the mask. Then, all marks will be located at a reflected position relative to the measurement system to be calibrated. If it is supported by a three-point support, the receiving portions (e.g. hemispheres) will be located at the identical three locations on the rear surface. If the receiving portions are distributed on the mask with an axis of symmetry, the geometry of the boundary condition only causes $\varepsilon$-type mask distortions (see FIG. 17), which do not interfere with the determination of the patterns of the other representations, in particular $\mathcal{A}2$.

In order to measure the marks which are located on the upper side of the mask after the reflection, the observation system is positioned from top to bottom and the illumination system is positioned from bottom to top (FIG. 18a). Exact positioning is not essential. They only have to be stationary with sufficient stability. If sufficient structural space is available, both system can also be designed in duplicate—once at the top, once at the bottom (FIG. 18b). Or, both optical systems are designed equally and are used for imaging at times and for illumination at other times by coupling beams in and out via prisms (FIG. 18c).

Other possible realizations have the object not to change the optical beam path at all, so that the same illumination and observation system can be used without shifting (FIG. 18d). For example, the test marks are not present on the mask surface, but in the middle of the volume, by joining two mask carriers of half-thickness—be it by optical contacting or by cementing (FIG. 19). Transparent (inverted) marks, embedded in a continuous chromium layer, are advantageous because they allow less potential inclusion of air when joining both halves.

Alternatively, the mask is not divided in the middle. The marks are applied on the thinner part. For reflection, only the thinner part is turned (FIG. 20). In this case, however, the imaging optics would have to compensate for the spherical aberrations caused by the difference in thickness of the substrate. Therefore, the aim is to make the lower half as thin as possible. This will incidentally obviate a large re-focusing area.

In the configuration preferred by us, the spherical aberration caused by transmission through the test mask is allowed for by the optical design of the microscope objective. The test mask can be made thinner than the standard masks (normally a quarter inch thick) to allow only for as much spherical aberration as absolutely necessary. In standard measurement, a small compensation plate of a thickness comparable to that of the test mask is placed in the beam path between the mask surface and the observation optics (FIG. 18e). The small compensation plate is removed only when the test mask is mirrored. By this approach, the marks are imaged on the camera without aberration in all positions.

Instead of reflecting the test mask itself and measuring it in a complex manner in the reflected position, it is possible to produce a more or less exact, but reflected, copy. Like a normal mask, this reflected copy is then inserted and measured in the measurement machine.

In the simplest variant, a contact copy of the test mask is made. The substrate for the copy, having chromium applied thereon coated with a photoresist, is optically contacted with the original and then exposed to ultraviolet light (FIG. 21). The structures will then appear inverted on the copy relative to the original. In order to prevent them from being inverted (to prevent the chromium and the gap swapping their roles), a positive resist is used.

Of course, instead of contacting, the structures may also be optically transferred to the copy by −1 imaging in a 4f arrangement (FIG. 23). In order to compensate for imaging errors of the optics, the original and the copy could trade places. Although the distortion will then switch its mathematical sign, its field distribution will still be reflected. Therefore, the $\mathcal{A}2$-type distortion errors will not be successfully eliminated in the retro arrangement.

The problems arising from imaging by exposure are avoided by the NanoImprint technology. If the original is suitable as a template, the raised marks will be imprinted as recesses in the photoresin of the copy (FIG. 22). There, the chromium will then be etched away, so that the reflected marks are inverted. The ultraviolet light is then no longer used for imaging, but only serves to cure the photoresin.

Another embodiment envisages to produce the copy together with the original test mask. In the case of a laser writer (laser patterner), the copy is exposed on its rear surface (see FIG. 24). In order that the beam deflection will not differ from the original, a blank plate of the same thickness is held in front of the original.

It should not be left unmentioned that only rotation-symmetric $\mathcal{A}2$ error patterns are recognized by the reflection operation. The other half, having $\mathcal{A}1$ symmetry, remains. However, in real measurement machines, the $\mathcal{A}2$ patterns are predominant by far (see FIGS. 4a-4f), so that the remaining $\mathcal{A}1$-symmetry plays only a minor role in practice.

Hexagonal Calibration

The reflecting calibration covers patterns having $\mathcal{A}2$ symmetry without difficulty. $\mathcal{A}1$-type patterns only apply to eccentric reflections. Functions not having full rotation symmetry can also be calibrated in a different manner.

Four-wave error patterns can be determined by effecting rotation not only by multiples of 90°. Combined with a 120° rotation, the angular blank is increased to twelve-wave portions (FIG. 25). In a preferred embodiment, the grid-invariant calibration is effected on a hexagonal grid (FIG. 26). The shifting directions will then no longer be orthogonal either, but will be at 60° relative to each other (or 120°, as in FIG. 11).

In the above exemplary embodiments, the invention was described with reference to the example of determining residual errors of measurement systems of object stages, in particular of registering coordinate measurement machines. However, the invention can generally be employed also to determine residual errors. For example, a two-dimensional pattern and the respective reflected and/or rotated and/or shifted patterns can be imaged as an object by means of an optical system, and the corresponding images can be subsequently recorded by a camera. By evaluation of the camera images, the imaging errors can then be determined with the corresponding symmetry. It is further possible, when measuring the wavefront interferences generated by an optical system by means of a shearing interferometer, to use the above-described method in order to determine unknown deviations of the shearing plate, using the shearing plate itself in a first measurement step and using shearing plates, reflected relative to the shearing plate of the first measurement step, in subsequent measurement steps.

In the above embodiments, amounts of deviation caused by shifting or unknown rotation of the test pattern in the various positions, i.e. so-called offsets, were not taken into consideration. This is because, since these offsets are the same for all measurement points or can be described, respectively, by the same linear transformation from one pattern to another, they can be easily determined by comparison of the patterns and can be subsequently removed by calculation, so that the determination of the remaining residual errors can be effected free from such offsets.

TABLE 1

Character table of the symmetry group $C_4$ for the three irreducible representations; the E representation can be further reduced only in a complex form

| χ | E | C2 | C4 | C4$^{-1}$ |
|---|---|----|----|-----------|
| 𝒜 | 1 | 1  | 1  | 1         |
| ℬ | 1 | 1  | -1 | -1        |
| ℰ | 2 | -2 | 0  | 0         |

TABLE 2

Group table for the $C_{4v}$ group

| E | $C_2$ | $C_4$ | $C_4^{-1}$ | $\sigma_v'$ | $\sigma_v''$ | $\sigma_d'$ | $\sigma_d''$ |
|---|---|---|---|---|---|---|---|
| $C_2$ | E | $C_4^{-1}$ | $C_4$ | $\sigma_v''$ | $\sigma_v'$ | $\sigma_d''$ | $\sigma_d'$ |
| $C_4$ | $C_4^{-1}$ | $C_2$ | E | $\sigma_d'$ | $\sigma_d''$ | $\sigma_v''$ | $\sigma_v'$ |
| $C_4^{-1}$ | $C_4$ | E | $C_2$ | $\sigma_d''$ | $\sigma_d'$ | $\sigma_v'$ | $\sigma_v''$ |
| $\sigma_v'$ | $\sigma_v''$ | $\sigma_d''$ | $\sigma_d'$ | E | $C_2$ | $C_4^{-1}$ | $C_4$ |
| $\sigma_v''$ | $\sigma_v'$ | $\sigma_d'$ | $\sigma_d''$ | $C_2$ | E | $C_4$ | $C_4^{-1}$ |
| $\sigma_d'$ | $\sigma_d''$ | $\sigma_v'$ | $\sigma_v''$ | $C_4$ | $C_4^{-1}$ | E | $C_2$ |
| $\sigma_d''$ | $\sigma_d'$ | $\sigma_v''$ | $\sigma_v'$ | $C_4^{-1}$ | $C_4$ | $C_2$ | E |

TABLE 3

Character table of the symmetry group $C_{4v}$ which consists of five irreducible representations. Each column corresponds to a class of symmetry operations whose number precedes the class designation.

| χ | E | C2 | 2 C4 | 2 $\sigma_v$ | 2 $\sigma_d$ |
|---|---|----|------|------|------|
| 𝒜1 | 1 | 1  | 1    | 1    | 1    |
| 𝒜2 | 1 | 1  | 1    | -1   | -1   |
| ℬ1 | 1 | 1  | -1   | 1    | -1   |
| ℬ2 | 1 | 1  | -1   | -1   | 1    |
| ℰ  | 2 | -2 | 0    | 0    | 0    |

The invention claimed is:

1. A method for determining residual errors, comprising:
   making a first measurement using a test plate comprising a first pattern, and
   making a second measurement using a test plate comprising a second pattern, in which the second pattern is rotated about a first axis of rotation relative to the first pattern, and shifted in a spatial direction by a first shifting vector between a center of the first pattern and the first axis of rotation,
   making a third measurement using a test plate comprising a third pattern, in which the third pattern is rotated about a second axis of rotation relative to the first pattern and shifted by a second shifting vector between the center of the first pattern and the second axis of rotation, and a vector sum of the first and second shifting vectors is zero, and
   determining the residual errors based on one or more of the first, second, and third measurements.

2. The method as claimed in claim 1, further comprising making a measurement using a test plate/test plates comprising one or more patterns which is/are rotated about an axis of rotation/axes of rotation relative to the first pattern and shifted by a shifting vector/shifting vectors between the center of the first pattern and the axis of rotation of the respective pattern, is/are used,
   wherein a vector sum of the first and the one or more further shifting vector(s) or of a subset of the first and the further shifting vectors is zero.

3. The method as claimed in claim 1, wherein the first, second, and third patterns are provided on or in one or more test plate(s).

4. A method for determining imaging errors of an optical system, comprising:
   determining residual errors using the method of claim 1, and
   determining the imaging errors of the optical system based on the residual errors.

5. The method as claimed in claim 1, wherein the residual errors of a measurement system of a stage, which can be shifted in at least one spatial direction, are determined by measuring, in each step, spatial positions of the patterns at several locations with the help of a further measurement system and evaluating the results of the measurements.

6. The method as claimed in claim 3, further comprising receiving the one or more test plates in respectively reproducible positions on a carrier in different rotary positions, shifting positions, or reflection positions using a receiving part which comprises several receiving portions.

7. The method as claimed in claim 5, wherein measurement of the patterns' position is effected with the help of a microscope comprising a camera.

8. The method as claimed in claim 5, wherein the measurement system of the stage, which is shiftable in at least one spatial direction, is calibrated on the basis of the residual errors thus determined.

9. The method as claimed in claim 5, wherein said stage is a reticle stage in a mask coordinate measurement device.

10. The method as claimed in claim 4, wherein the patterns are imaged by the optical system and the images generated are analyzed and evaluated.

11. The method as claimed in claim 4, wherein a further test pattern is imaged by the optical system and the method as claimed in claim 1 is employed to analyze the image of the further test pattern.

12. The method as claimed in claim 11, wherein the test plate having the first pattern is a shearing plate in a shearing interferometer.

13. A method for determining residual errors, comprising:
    making a first measurement using a test plate comprising a first Cartesian pattern,
    making a second measurement using a test plate comprising a pattern rotated relative to the first Cartesian pattern,
    making a third measurement using a test plate comprising a hexagonal pattern,
    making a fourth measurement using a test plate comprising a pattern rotated relative to the hexagonal pattern, and
    determining the residual errors based on one or more of the first, second, third, and fourth measurements.

14. The method as claimed in claim 13, wherein the pattern rotated relative to the first Cartesian pattern is rotated around an angle of 90° relative to the first Cartesian pattern and the pattern rotated relative to the hexagonal pattern is rotated around an angle of 60° relative to the hexagonal pattern.

15. The method of claim 13 in which the first Cartesian pattern, the pattern rotated with respect to the first Cartesian pattern, the hexagonal pattern, and the pattern rotated relative to the hexagonal pattern are provided on or in one or more test plate(s).

16. A method for determining residual errors, comprising:
    making a first measurement using a test plate comprising a first Cartesian pattern,
    making a second measurement using a test plate comprising a pattern rotated relative to the first Cartesian pattern,
    making a third measurement using a test plate comprising a trigonal pattern,
    making a fourth measurement using a test plate comprising a pattern rotated relative to the trigonal pattern, and
    determining the residual errors based on one or more of the first, second, third, and fourth measurements.

17. The method as claimed in claim 16, wherein the pattern rotated relative to the first Cartesian pattern is rotated around an angle of 90° relative to the first Cartesian pattern and the pattern rotated relative to the trigonal pattern is rotated around an angle of 120° relative to the trigonal pattern.

18. The method of claim 16 in which the first Cartesian pattern, the pattern rotated relative to the first Cartesian pattern, the trigonal pattern, and the pattern rotated relative to the trigonal pattern are provided on or in one or more test plate(s).

19. A stage which can be linearly shifted in at least one spatial direction, comprising a measurement system for determining a shifting position and/or shifting paths of the stage, wherein residual errors of the measurement system are determined based on measurements of spatial positions of a first pattern on a test plate at several locations,
    measurements of spatial positions of a second pattern on a test plate at several locations, the second pattern being rotated about a first axis of rotation relative to the first pattern, and shifted in a spatial direction by a first shifting vector between a center of the first pattern and the first axis of rotation, and
    measurements of spatial positions of a third pattern on a test plate at several locations, the third pattern being rotated about a second axis of rotation relative to the first pattern and shifted by a second shifting vector between the center of the first pattern and the second axis of rotation, in which a vector sum of the first and second shifting vectors is zero,
    wherein the measurements of the patterns are made with the help of another measurement system.

20. A registration measurement machine for measuring the position of marks on a mask, comprising a stage which can be linearly shifted in at least one spatial direction, a measurement system for determining a shifting position and/or shifting paths of the stage, wherein residual errors of the measurement system are determined based on measurements of spatial positions of a first pattern on a test plate at several locations,
    measurements of spatial positions of a second pattern on a test plate at several locations, the second pattern being rotated about a first axis of rotation relative to the first pattern, and shifted in a spatial direction by a first shifting vector between a center of the first pattern and the first axis of rotation, and
    measurements of spatial positions of a third pattern on a test plate at several locations, the third pattern being rotated about a second axis of rotation relative to the first pattern and shifted by a second shifting vector between the center of the first pattern and the second axis of rotation, in which a vector sum of the first and second shifting vectors is zero,
    wherein the measurements of the patterns are made with the help of another measurement system.

21. A method for determining residual errors, comprising:
    making a first measurement using a test plate comprising a first pattern,
    making a second measurement using a test plate comprising a second pattern, in which the second pattern is obtained from the first pattern by reflection along an axis of reflection located in a plane of the first pattern, and
    determining the residual errors based on the first and second measurements.

* * * * *

UNITED STATES PATENT AND TRADEMARK OFFICE
CERTIFICATE OF CORRECTION

PATENT NO. : 8,416,412 B2
APPLICATION NO. : 12/513452
DATED : April 9, 2013
INVENTOR(S) : Uwe Schellhorn and Matthias Manger It is certified that error appears in the above-identified patent and that said Letters Patent is hereby corrected as shown below:

In the Specification

Column 3
Line 66, delete "$C_{v4}$-group" and insert -- $C_{4v}$ group; --

Column 6
Lines 53-54 (approx.), delete
" $C_2 \cdot d = A_1\{d\} + A_2\{d\} + B_1\{d\} + B_2\{d\} - \{d\}E_1^{'}\{d\} - E_2^{'}\{d\}$ "

and insert -- $C_2 \cdot d = A_1\{d\} + A_2\{d\} + B_1\{d\} + B_2\{d\} - E_1^{'}\{d\} - E_2^{'}\{d\}$ --

Column 7
Line 17, delete "A(d)" and insert -- A{d} --

Column 8
Line 28, delete "A1" and insert -- A1- --
Line 55 (Approx.), delete "," and insert -- $d_A$ --

Column 10
Line 43, delete "NanoImprint" and insert -- NanoImprint --

Signed and Sealed this
Thirtieth Day of July, 2013

Teresa Stanek Rea
*Acting Director of the United States Patent and Trademark Office*